(12) United States Patent
Nathan et al.

(10) Patent No.: US 8,334,863 B2
(45) Date of Patent: Dec. 18, 2012

(54) DISPLAY SYSTEM WITH A SOLAR CELL AND DEVICE HAVING THE SAME

(75) Inventors: Arokia Nathan, Cambridge (GB); G. Reza Chaji, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 229 days.

(21) Appl. No.: 12/342,250

(22) Filed: Dec. 23, 2008

(65) Prior Publication Data

US 2009/0219273 A1   Sep. 3, 2009

(30) Foreign Application Priority Data

Dec. 24, 2007 (CA) .................................... 2617752

(51) Int. Cl.
*G06F 3/038* (2006.01)
*G09G 3/36* (2006.01)

(52) U.S. Cl. .................... 345/211; 349/116; 136/243
(58) Field of Classification Search ................. 345/211; 349/113, 116; 136/243–265
See application file for complete search history.

(56) References Cited

U.S. PATENT DOCUMENTS

| | | | |
|---|---|---|---|
| 6,252,248 B1 | 6/2001 | Sano et al. | |
| 6,373,453 B1 | 4/2002 | Yudasaka | |
| 6,445,376 B2 * | 9/2002 | Parrish | 345/156 |
| 7,220,997 B2 | 5/2007 | Nakata | |
| 7,319,465 B2 | 1/2008 | Mikami et al. | |
| 7,339,636 B2 | 3/2008 | Voloschenko et al. | |
| 2003/0140958 A1 * | 7/2003 | Yang et al. | 136/244 |
| 2004/0113903 A1 | 6/2004 | Mikami et al. | |
| 2005/0035709 A1 * | 2/2005 | Furuie et al. | 313/506 |
| 2005/0117096 A1 | 6/2005 | Voloschenko et al. | |
| 2005/0225686 A1 | 10/2005 | Brummack et al. | |
| 2005/0260777 A1 | 11/2005 | Brabec et al. | |
| 2006/0264143 A1 | 11/2006 | Lee et al. | |

(Continued)

FOREIGN PATENT DOCUMENTS

CA   2483645 A1   12/2003

(Continued)

OTHER PUBLICATIONS

Alexander et al.: "Pixel circuits and drive schemes for glass and elastic AMOLED displays"; dated Jul. 2005 (9 pages).

(Continued)

*Primary Examiner* — Seokyun Moon
(74) *Attorney, Agent, or Firm* — Nixon Peabody LLP

(57) ABSTRACT

A display system and a device having the display system are provided. The display system includes: a pixel area on which a pixel is formed; a substrate having a top side and a back side opposite to the top side, and a plurality of edges between the top side and the back side, the substrate being a main substrate on which the pixel area being formed or a sealing substrate; and a solar cell area having at least one solar cell integrated on a peripheral of the pixel area, the edge of the substrate or a combination thereof. The display system includes: a pixel area on a display substrate, including: a transparent electrode; and an emissive device for emitting a light, the transparent electrode and the emissive device being aligned in series on the display substrate, a solar cell placed behind the transparent electrode, for making the transparent electrode non-reflective to the emissive device. The device includes: the display system, and a chargeable power source electrically connected to the solar cell for supplying an operation power to the device.

8 Claims, 10 Drawing Sheets

U.S. PATENT DOCUMENTS

2010/0079711 A1* 4/2010 Tanaka .................. 349/116

FOREIGN PATENT DOCUMENTS

| DE | 20 2006 005427 | 6/2006 |
|---|---|---|
| EP | 0 940 796 | 9/1999 |
| EP | 1 028 471 | 8/2000 |
| EP | 1 467 408 | 10/2004 |
| JP | 09-090405 | 4/1997 |
| JP | 2002268576 | 9/2002 |
| WO | WO2006/137337 A1 * | 12/2006 |

OTHER PUBLICATIONS

Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-µA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated May 2003 (4 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High- Resolution a-Si:H AMOLED Displays"; dated Oct. 2008 (6 pages).
Chaji et al.: "Thin-Film Transistor Integration for Biomedical Imaging and AMOLED Displays"; dated 2008 (177 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Philipp: "Charge transfer sensing" Sensor Review, vol. 19, No. 2, Dec. 31, 1999, 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
European Search Report and Written Opinion for Application No. 08 86 5338, mailed Nov. 2, 2011, 7 pages.

* cited by examiner

DISPLAY SYSTEM WITH A SOLAR CELL AND DEVICE HAVING THE SAME

FIELD OF INVENTION

The present invention relates to display devices, and more specifically to a system for reducing power consumption for the display devices.

BACKGROUND OF THE INVENTION

Active matrix organic light emitting diode displays (AMOLEDS) and active matrix liquid crystal displays (AM-LCDs) are well known in the art. These displays are used in a variety of applications, such as, mobile devices including cellular phones, PDAs, handheld image scanners.

A major portion of useful display luminance (30%-50%) emitted in an OLED display, for instance, is lost in the substrate due to the wave-guiding effect. This effect causes emitted light to reflect away from the useful viewing plane of the display and out towards the edges. This is undesirable and reduces display luminous efficacy which increases power consumption and lowers battery life for handheld devices, for example.

Some attempts have been made to use techniques to integrate solar cells within the pixels of an active matrix display so that a solar cell captures all the light that are back reflected. However, these techniques are complex and difficult to integrate the solar cells within the pixels, thus lower devices yield and increase cost. There is a need to provide a display system that reduces power consumption, ensures higher devices yield and reduces cost.

SUMMARY OF THE INVENTION

It is an object of the invention to provide a method and system that obviates or mitigates at least one of the disadvantages of existing systems.

According to an aspect of the present invention there is provided a display system which includes: a pixel area on which a pixel is formed; a substrate having a top side and a back side opposite to the top side, and a plurality of edges between the top side and the back side, the substrate being a main substrate on which the pixel area being formed or a sealing substrate; and a solar cell area having at least one solar cell integrated on a peripheral of the pixel area, the edge of the substrate or a combination thereof.

According to another aspect of the present invention there is provided a device which includes: a display system having: a pixel area on which a pixel is formed; a substrate having a top side and a back side opposite to the top side, and a plurality of edges between the top side and the back side, the substrate being a main substrate on which the pixel area being formed or a sealing substrate; and a solar cell area having at least one solar cell and integrated on a peripheral of the pixel area, the edge of the substrate or a combination thereof, and a chargeable power source electrically connected to the solar cell for supplying an operation power to the device.

According to a further aspect of the present invention there is provided a display system which includes: a pixel area on a display substrate, including: a transparent electrode; and an emissive device for emitting a light, the transparent electrode and the emissive device being aligned in series on the display substrate, a solar cell placed behind the transparent electrode, for making the transparent electrode non-reflective to the emissive device.

According to a further aspect of the present invention there is provided a device which includes: a display system including: a pixel area on a display substrate, including: a transparent electrode; and an emissive device for emitting a light, the transparent electrode and the emissive device being aligned in series on the display substrate, and a solar cell placed behind the transparent electrode, for making the transparent electrode non-reflective to the emissive device, and a chargeable power source electrically connected to the solar cell for supplying an operation power to the device.

BRIEF DESCRIPTION OF THE DRAWINGS

These and other features of the invention will become more apparent from the following description in which reference is made to the appended drawings wherein.

DETAILED DESCRIPTION

Figure 1:
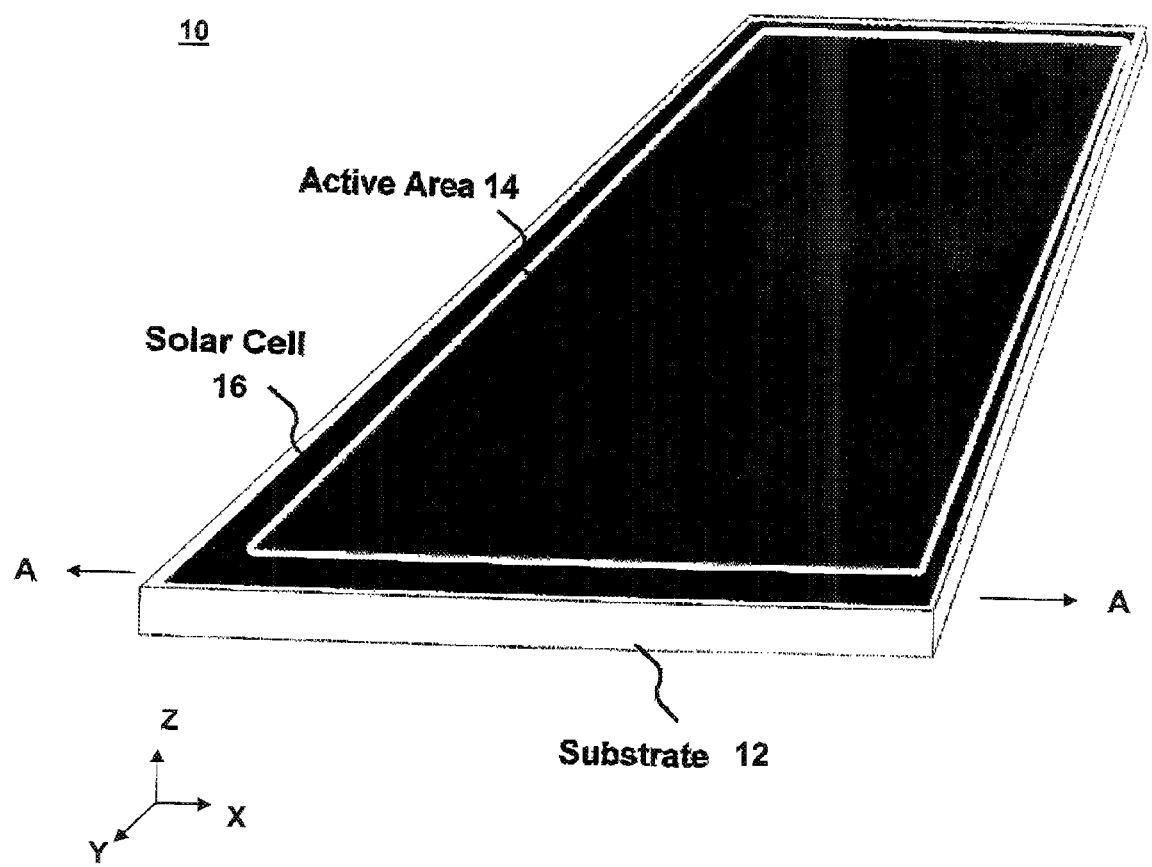
FIG. 1 illustrates an example of a display system with a solar cell in accordance with an embodiment of the present invention.

Referring to FIG. 1, one example of a display system in accordance with an embodiment of the present invention is described. The display system 10 of FIG. 1 includes a substrate 12, an active area 14, and a solar cell area 16. The display system 10 is a flat panel display, and may be formed by any technology, including active matrix organic light emitting diode displays (AMOLEDs) or active matrix liquid crystal displays (AMLCDs).

One or more solar cells are formed in the solar cell area 16, each having a light receiving active surface as well known in the art. In the description below, the terms "solar cell area 16" and "solar cell(s) 16" are used interchangeably. The solar cell 16 directly or indirectly supplies operation power to the pixels of the display system 10.

The display system 10 may be used in a portable (mobile) device, such as, but not limited to, a cellular phone, a personal digital assistant (PDA), a handheld image (barcode) scanner/reader, and a computer display.

The substrate 12 has a top side, a back side opposite to the top side, and edges between the top side and the back side. The active area 14 is formed on the top side of the substrate 12. A plurality of pixels are formed in the active area 14. The pixel includes a light emitting device, such as, an organic light emitting device (OLED) or a liquid crystal (LC), as well understood by one of ordinary skill in the art. The pixel may include a thin film transistor (TFT). The substrate 12 may be a main substrate on which the solar cell and the pixel are integrated. A sealing substrate for protecting the display may be formed on the top of the active area 14. The substrate 12 may be the sealing substrate, and the main substrate may be on the active area 14.

In FIG. 1, the substrate 12 has a rectangular shape with one top side, one back side and four edges. However, the substrate 12 and the display system 10 may have a shape different from that of FIG. 1, as would be appreciated by one of ordinary skill in the art.

The solar cell 16 is integrated on the peripheral of the active area 14. In FIG. 1, the active area 14 is on the top side of the substrate 12, and thus, the solar cell is integrated on the peripheral of the top surface of the substrate 12. In one example, the solar cell area 16 is formed so as to surround the active area 14 as shown in FIG. 1. However, in another example, the solar cell area 16 may be formed on a part of the peripheral of the active area 14. The solar cell 16 and the active area 14 are physically separated, during the fabrication or integration. They are put on different area of the glass.

Figure 2:
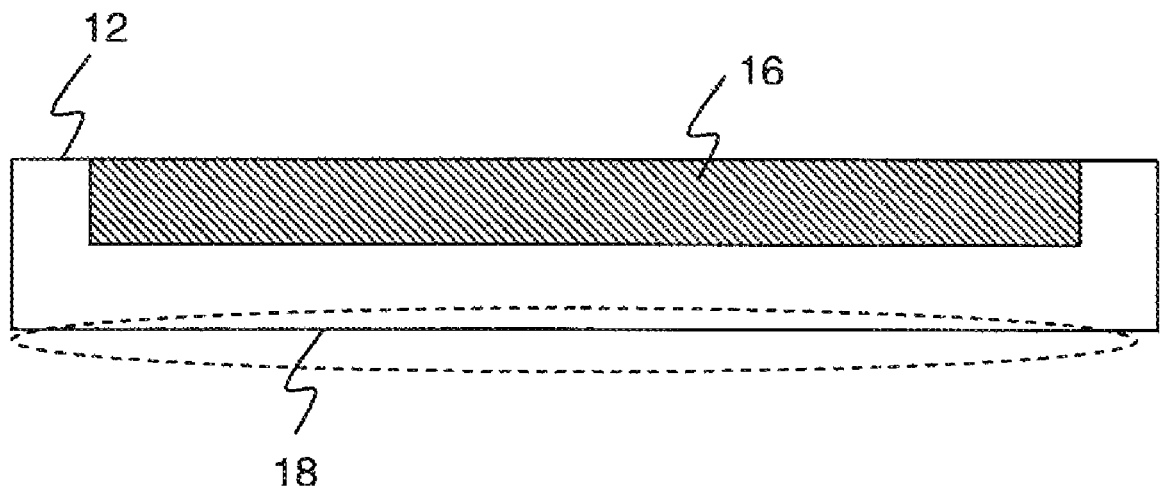
FIG. 2 illustrates an exemplary cross section view of the display system of FIG. 1, taken through A-A of FIG. 1.

In one example, surface treatment is implemented on the back side 18 of the substrate 12 as shown in FIG. 2, in order to improve reflection of a light to the solar cell 16 and thus increase optical collection efficiency. The surface treatment may be implemented on the edge(s) of the substrate 12. The surface treatment may be implemented on the back side 18 and the edge(s) of the substrate 12.

Figure 3:
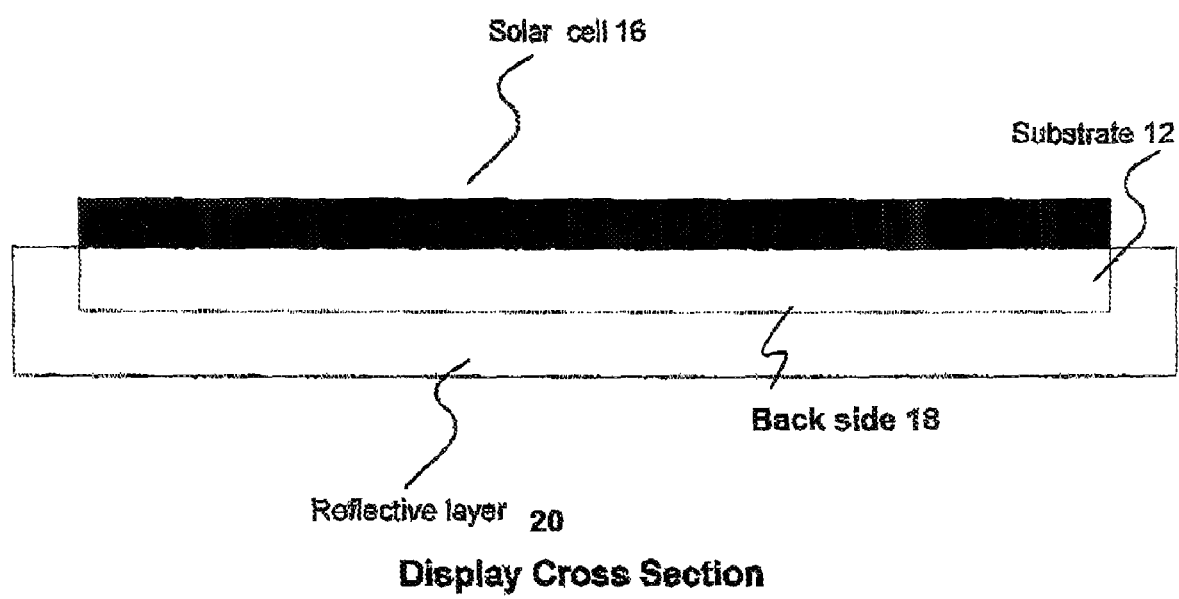
FIG. 3 illustrates another example of the display system with the solar cell.

In another example, a reflection layer 20 may be disposed on the back side 18, the edge(s) of the substrate 12 or combinations thereof. In FIG. 3, the reflective layer 20 is formed so as to surround the back side 18 and the edges of the substrate 12. The reflection layer 20 on the back side 18, the edge(s) of the substrate 12 or combinations thereof improves reflection and thus increase optical collection efficiency.

In a further example, the combination of the surface treatment and the reflective layer 20 may be used on the back side 18, the edge(s) or combination thereof of the substrate 12.

In these examples, a light is reflected from the back side 18, the edge(s) of the substrate 12 or combinations thereof to the top side of the substrate 12.

Referring to FIGS. 1-3, the manufacturing process of the display system 10 can be different depending on what type of solar cell to be used. It can be done in different order (e.g., fabricating the active area 14 first, then fabricating/integrating the solar cell 16; or partially fabricating the active area 14 and then fabricating/integrating the solar cell 16, etc). One of ordinary skill in the art would understand the manufacturing process of the display system 10 (FIGS. 1-3). The solar cell area 16 placed along the periphery of the active area 14 results in lowering implementation complexity and costs.

The solar cell 16, like the backplane, can be any technology including (but not limited to) amorphous silicon, crystalline silicon, solution-processed polymer and vacuum-deposited organic semiconductors, including organic-inorganic nanocomposites, or III-IV semiconductors. The solar cell 16 can have different structures such as tandem or single architectures, and can be a thin or thick film or module-type device. Implementation of the solar cell 16 onto the display can be either based on seamless integration directly onto the substrate or assembled onto the panel.

Depending on the technology, the solar cell 16 can be tuned, for example, to maximize light conversion efficiency in the visible range (400-700 nm) or over a broader spectrum (including the IR and UV spectrums, for example).

Any ambient light incident on the active area 14 is itself further wave-guided through the substrate 12 and reflects out at the peripheral/edges as well, which can also be harvested.

The display system 10 may be used in a device having a rechargeable battery that electrically connects to the solar cell 16. The solar cell 16 at the display periphery generates power for charging such a battery, for example, in regenerative fashion either by its own emitted light or when the device is exposed to ambient light or both.

In addition, since the solar cell 16 is physically separated from the flat panel display active area 14, it reduces device complexity, improve yield and pixel aperture ratio, and achieve lower costs.

Figure 4:
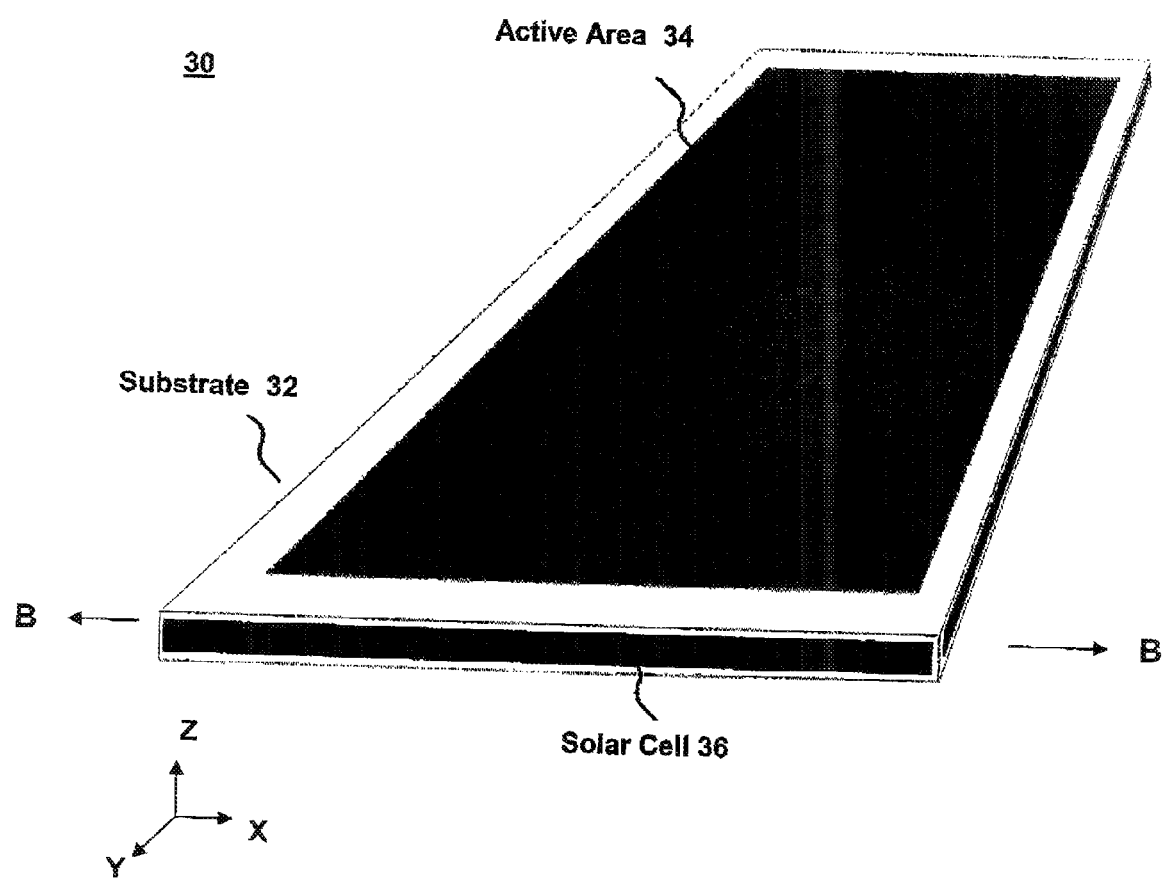
FIG. 4 illustrates an example of a display system in accordance with another embodiment of the present invention.

Referring to FIG. 4, an example of a display system in accordance with a further embodiment of the present invention is described. The display system 30 of FIG. 4 includes a substrate 32, an active area 34, and a solar cell area 36. The display system 30 may be a flat panel display, and may be formed by any technology, including AMOLEDs or AMLCDs.

One or more solar cells are formed in the solar cell area 36, each having a light receiving active surface as well known in the art. In the description below, the terms "solar cell area 36" and "solar cell(s) 36" are used interchangeably. The solar cell 36 directly or indirectly supplies operation power to the pixels of the display system 30.

The display system 30 may be used in a portable (mobile) device, such as, but not limited to, a cellular phone, a personal digital assistant (PDA), a handheld image (barcode) scanner/reader, and a computer display.

The substrate 32 has a top side, a back side opposite to the top side, and edges between the top side and the back side. The active area 34 is formed on the top side of the substrate 32. A plurality of pixels are formed in the active area 34. The active area 34 may be the same or similar to the active area 14 of FIG. 1. The substrate 32 may be the same or similar to the substrate 12 of FIG. 1. The substrate 32 may be a main substrate on which the solar cell and the pixel are integrated. A sealing substrate for protecting the display may be formed on the top of the active area 34. The substrate 32 may be the sealing substrate, and the main substrate may be on the active area 34.

In FIG. 4, the substrate 32 has a rectangular shape with one top side, one back side and four edges. However, the substrate 32 and the display system 30 may have a shape different from that of FIG. 4, as would be appreciated by one of ordinary skill in the art. For example, the substrate 32 may have three edges or more than four edges.

Figure 5:
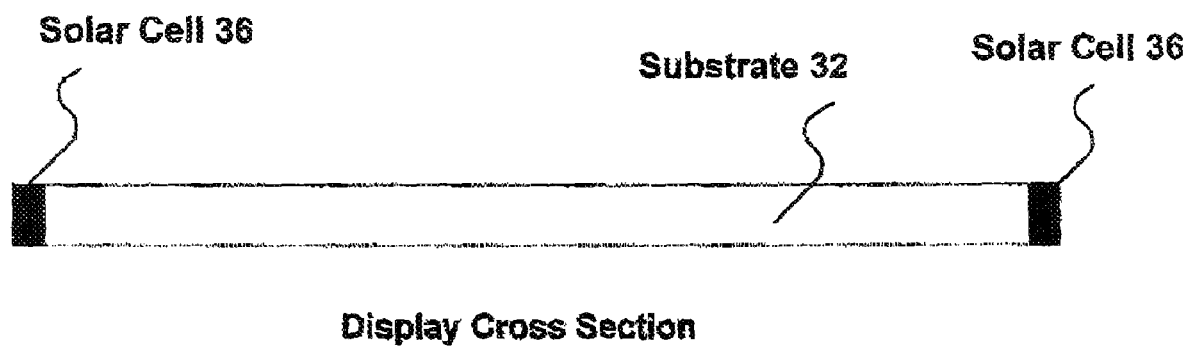
FIG. 5 illustrates an exemplary cross section view of the display system of FIG. 4, taken through B-B of FIG. 4.

The solar cell 36 is integrated on one or more than one edge of the substrate 32. The solar cells 36 may be integrated on all of the edges of the substrate 32 or some of the edges of the substrate 32. In one example, the solar cell area 36 is integrated on all of the edges of the substrate 32 as shown in FIGS. 4-5. In another example, the solar cell area 36 may be formed on a part of the edges of the substrate 32. The solar cell 36 and the active area 34 are physically separated, during the fabrication or integration. They are put on different area of the glass.

Referring to FIGS. 4-5, the manufacturing of the display system 30 can be different depending on what type of solar cell to be used. It can be done in different order (e.g. fabricating the active area 34 first, then fabricating/integrating the solar cell 36; or partially fabricating the active area 34 and then fabricating/integrating the solar cell 36; or . . . ). One of ordinary skill in the art would understand the manufacturing process of the display system 30 (FIGS. 4-5). The solar cell area 36 placed along the edge(s) of the substrate 32 results in lowering implementation complexity and costs.

Any ambient light incident on the active area 34 is itself further wave-guided through the substrate 32 and reflects out at the edges as well, which can also be harvested.

The display system 30 may be used in a device having a rechargeable battery that electrically connects to the solar cell 36. The solar cell 36 at the display edge generates power for charging such a battery, for example, in regenerative fashion either by its own emitted light or when the device is exposed to ambient light or both.

In addition, since the solar cell 36 is physically separated from the flat panel display active area 34, it reduces device complexity, improve yield and pixel aperture ratio, and achieve lower costs.

In the above examples, the solar cell is integrated on the peripheral of the top side of the substrate (FIG. 1) or on an edge of the substrate (FIG. 3). However, it would be understood by one of ordinary skill in the art that the solar cells can be integrated on the peripheral of the substrate and one or more than one edge of the substrate. This arrangement further improves both the power and light collection efficiencies of the system.

Figure 6:
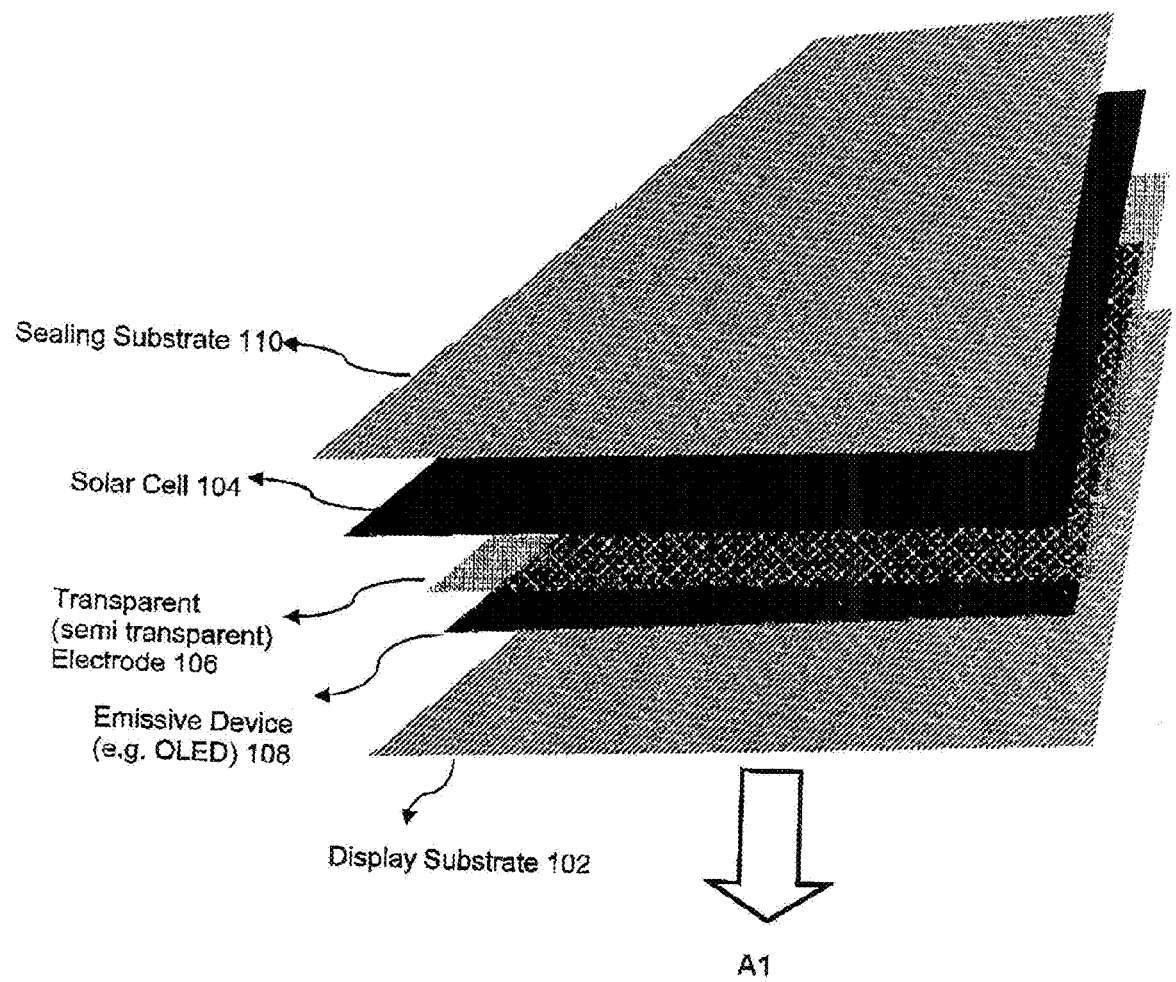
FIG. 6 illustrates an example of a display system having a solar cell in accordance with a further embodiment of the present invention.
Figure 7:
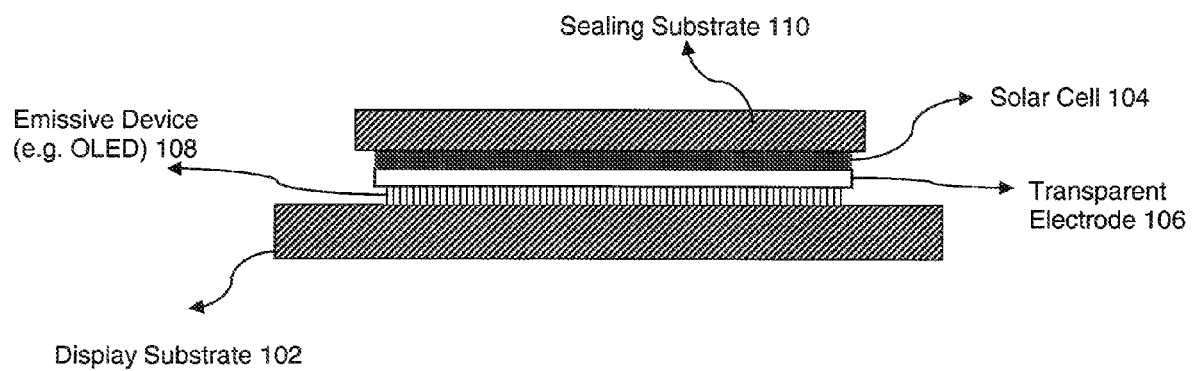
FIG. 7 illustrates an exemplary cross section view of the display system of FIG. 6.

Referring to FIGS. 6 and 7, one example of a display system in accordance with a further embodiment of the present invention is described. The display system 100 of FIGS. 6 and 7 is a bottom emission display. In FIG. 6, "A1" represents the direction of a front screen. The display system 100 may be formed by any technology, including active matrix organic light emitting diode displays (AMOLEDs) or active matrix liquid crystal displays (AMLCDs). The display system 100 may be used in a portable (mobile) device, such as, but not limited to, a cellular phone, a personal digital assistant (PDA), a handheld image (barcode) scanner/reader, and a computer display. As described below, in the display system 100, a solar cell is placed behind the pixel.

The display system 100 includes a display substrate 102, at least one solar cell 104, a common electrode 106, an emissive device 108, and a sealing substrate 110. The solar cell 104 may be the same or similar to the solar cell 16 of FIG. 1 or the solar cell 36 of FIG. 4. The substrate 102 may be the same or similar to the substrate 12 of FIG. 1 or the substrate 32 of FIG. 4. The pixels of the display system 100 may be the same or similar to those of FIG. 1 or FIG. 4. The solar cell 104 directly or indirectly supplies operation power to the pixels of the display system 100.

In FIGS. 6 and 7, the substrate 102 has a rectangular shape with one top side, one back side and four edges. However, the substrate 102 and the display system 100 may have a shape different from that of FIGS. 6 and 7, as would be appreciated by one of ordinary skill in the art.

The common electrode 106 is transparent (or semi-transparent) electrode, and is used for the pixels (e.g., emissive device 108). In the description, the terms "common electrode 106" and "transparent electrode 106" are used interchangeably. The term "transparent" in this context includes "semi-transparent" as will understood by one of ordinary skill in the art. The emissive device 108 includes, for example, but not limited to an OLED of a pixel. The transparent electrode 106 is formed on top of the emissive device 108. On top of the transparent electrode 106 (i.e., the back of the screen) the solar cell 104 is integrated. The solar cell 104 is placed in the back of the emissive device 108 so that it can reduce the reflection and generate electrical power.

The solar cell 104 is placed behind the transparent electrode 106 so as to make the transparent electrode 106 non-reflective to the emissive device 108. The solar cell 104 works as a black matrix for preventing a light leakage phenomenon as well as enabling energy harvesting/recovery. The black matrix cuts down on reflections and improves contrast, without the use of an additional special film.

The sealing substrate 110 is a substrate and formed on top of the display to protect it from moisture, oxygen and other ambient elements. The solar cell 104 may be prefabricated on the sealing substrate 110 to improve the yield and efficiency.

In a further example, surface treatment may be implemented to the sealing substrate 110 for reflection of a light to the solar cell 104. In a further example, a reflective layer, which may be the same or similar to the reflective layer 20 of FIG. 3, may be formed on the sealing substrate 110 for reflection of a light to the solar cell 104. The surface treatment and the reflective layer may be used for the display system 100.

The solar cell 104 collects the excessive light from the display going in a direction opposite to A1, and also collects the ambient light. The collecting ambient light will improve the contrast ratio besides harvesting energy. As a result, one can eliminate, from the display structure, a polarizer layer for polarizing light passing therethrough and thus enhancing brightness. The display system 100 does not require putting the polarizer layer on the front screen, improving the light out coupling. This will improve the display power consumption, lifetime and sunlight readability.

In a further example, the structure of the display system 100 of FIG. 6 may be integrated to the display system 10 of FIG. 1 or 30 of FIG. 4. The solar cell 104 may be formed on the peripheral of the pixel area, edge(s) of the sealing substrate 110/the display substrate 102 or combination thereof.

Figure 8:
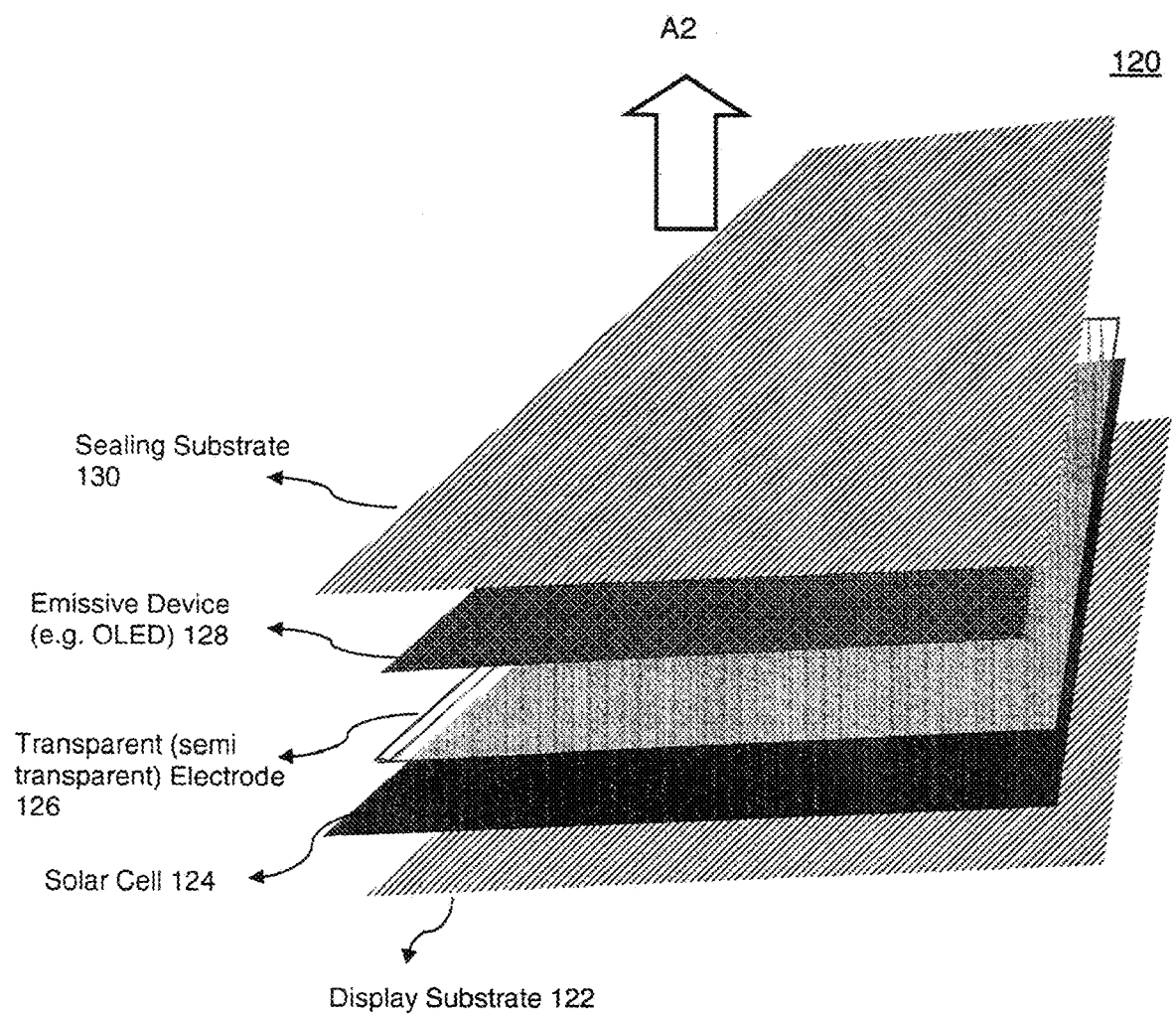
FIG. 8 illustrates an example of a display system having a solar cell in accordance with a further embodiment of the present invention.
Figure 9:
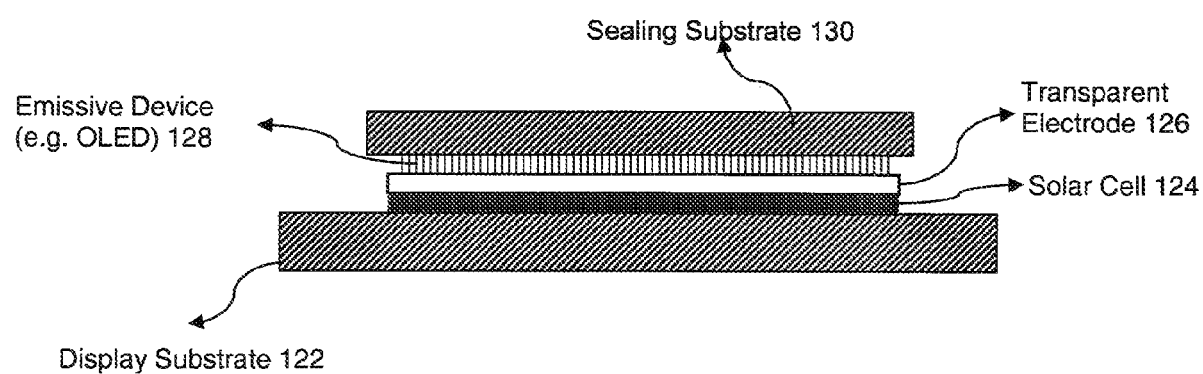
FIG. 9 illustrates an exemplary cross section view of the display system of FIG. 8.

Referring to FIGS. 8 and 9, one example of a display system in accordance with a further embodiment of the present invention is described. The display system 120 of FIGS. 8 and 9 is a top emission display. In FIG. 8, "A2" represents the direction of a front screen. The display system 120 may be formed by any technology, including active matrix organic light emitting diode displays (AMOLEDs) or active matrix liquid crystal displays (AMLCDs). The display system 120 may be used in a portable (mobile) device, such as, but not limited to, a cellular phone, a personal digital assistant (PDA), a handheld image (barcode) scanner/reader, and a computer display. As described below, in the display system 120, a solar cell is placed behind the pixel.

The display system 120 includes a display substrate 122, at least one solar cell 124, a common electrode 126, an emissive device 128, and a sealing substrate 130. The display substrate 122 may be the same or similar to the substrate 102 of FIG. 6. The solar cell 124 may be the same or similar to the solar cell 104 of FIG. 6. The common electrode 126 may be the same or similar to the common electrode 106 of FIG. 6. The emissive device 128 may be the same or similar to the emissive device 108 of FIG. 6. The sealing substrate 130 may be the same or similar to the sealing substrate 110 of FIG. 6. The solar cell 124 directly or indirectly supplies operation power to the pixels of the display system 120.

In the description, the terms "common electrode 126" and "transparent electrode 126" are used interchangeably. The term "transparent" in this context includes "semi-transparent" as will understood by one of ordinary skill in the art.

In FIGS. 8 and 9, the substrate 122 has a rectangular shape with one top side, one back side and four edges. However, the substrate 122 and the display system 120 may have a shape different from that of FIGS. 8 and 9, as would be appreciated by one of ordinary skill in the art.

In the display system 120 on top of the substrate 122 (i.e., the back of the screen) the solar cell 124 is integrated. The common electrode 126 is formed between the solar cell 124 and the emissive device 128. The sealing substrate 130 is formed on top of the emissive device 128. The solar cell 124 is placed in the back of the emissive device 128 so that that it can reduce the rejection and generate electrical power.

The solar cell 124 is placed behind the transparent electrode 126 so as to make the transparent electrode 126 non-reflective to the emissive device 128. The solar cell 124 works as a black matrix for preventing a light leakage phenomenon as well as enabling energy harvesting/recovery. The black matrix cuts down on reflections and improves contrast, without the use of an additional special film.

In a further example, surface treatment may be implemented to the back side of the display substrate 122 for reflection of a light to the solar cell 124. In a further example, a reflective layer, which may be the same or similar to the reflective layer 20 of FIG. 3, may be formed on the back side of the display substrate 120 for reflection of a light to the solar cell 124. The surface treatment and the reflective layer may be used for the display system 120.

The solar cell 124 collects the excessive light from the display going in the wrong direction (opposite to A2), and also collects the ambient light. The collecting ambient light will improve the contrast ratio besides harvesting energy. As a result, one can eliminate, from the display structure, a polarizer layer for polarizing light passing therethrough and thus enhancing brightness. The display system 120 does not require putting the polarizer layer on the front screen, improving the light out coupling. This will improve the display power consumption, lifetime and sunlight readability.

In a further example, the structure of the display system 120 of FIG. 8 may be integrated to the display system 10 of FIG. 1 or 30 of FIG. 4. The solar cell 124 may be formed on the peripheral of the pixel area, edge(s) of the display substrate 122/the sealing substrate 130 or combination thereof.

Figure 10:
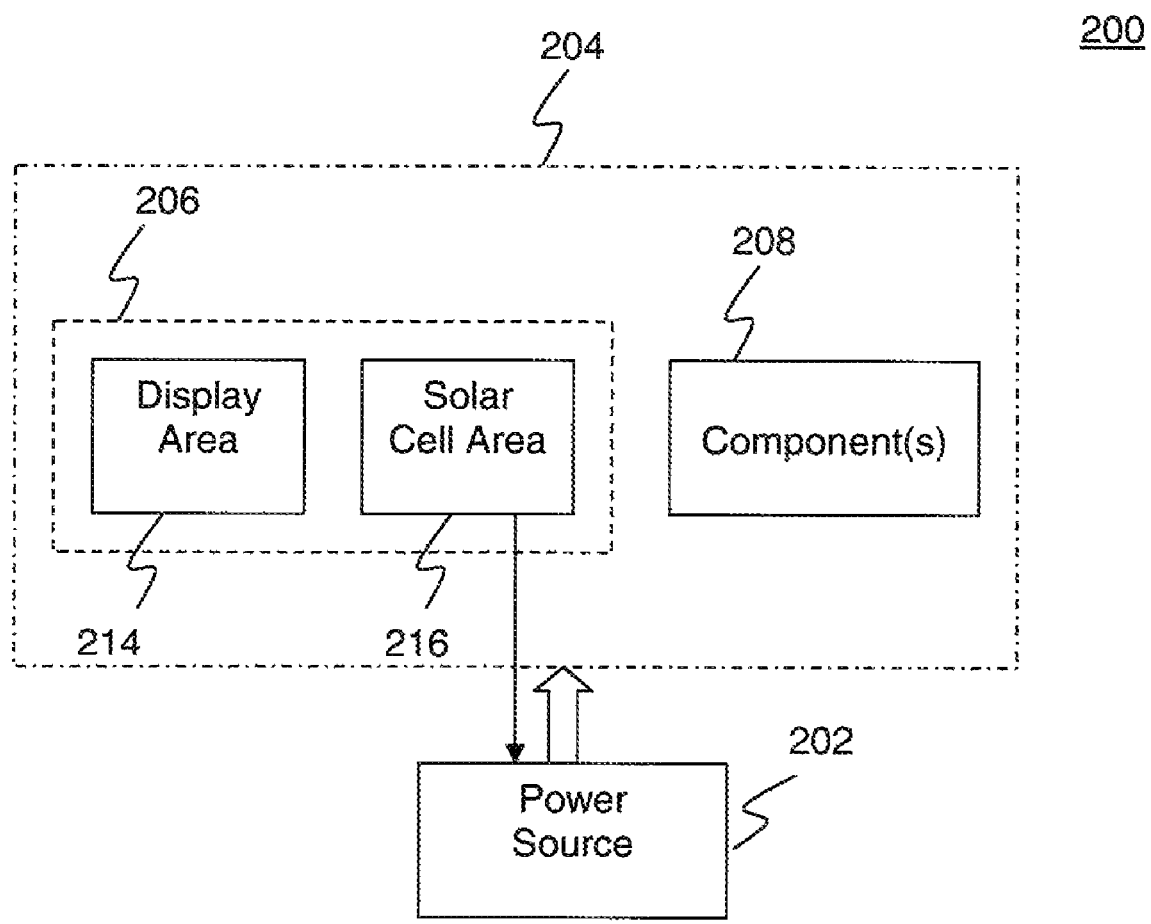
FIG. 10 illustrates an example of a device having a display system in accordance with an embodiment of the present invention.

Referring to FIG. 10, an example of a device having a display system is described. The device 200 of FIG. 10 may be a portable device, such as, but not limited to, a cellular phone, a personal digital assistant (PDA), a handheld image (barcode) scanner/reader, and a computer display.

The device 200 includes a rechargeable power source 202 and a device component 104 to which the power source 202 provides an operation power. The device component 204 has one or more components including a display system 206. The device component 204 may have electrics/modules 108 including, for example, but not limited to, one or more onboard processors, communications modules for facilitating wireless/wired communications, user interfaces.

The display system 206 includes a display area 214 and a solar cell area 216. The display system 206 may correspond to the display system 10 of FIG. 1, the display system 30 of FIG. 4, the display system 100 of FIG. 6, the display system 120 of FIG. 8, or combinations thereof. The display area 214 may be the same or similar to the active area 14 of FIG. 1, the active area 34 of FIG. 3, the pixel area of FIG. 6 or the pixel area of FIG. 8. The display area 214 is formed on a substrate (not shown) that may be the same or similar to the substrate 12 of FIG. 1, the substrate 32 of FIG. 3, the display substrate 102 of FIG. 6 or the display substrate 122 of FIG. 8. The solar cell area 216 may be the same or similar to the solar cell 16 of FIG. 1, the solar cell 36 of FIG. 3, the solar cell 104 of FIG. 6 or the solar cell 124 of FIG. 8. The power source 202 is connected to the solar cell area 216 so that it is charged by the solar cell(s) in the solar cell area 216.

The display system 206 is disposed in the device so that a user of the device 200 can look at the display. The display system 200 may be disposed in the device so that the solar cell area 216 can convert solar energy into electricity by the photovoltaic effect. The solar cell area 216 generates power for charging the power source 202 in regenerative fashion either by its own emitted light or when the device is exposed to ambient light or both.

In one example, the solar cell area 216 is integrated on the peripheral of the display area 214, the edge(s) of the substrate or combinations thereof. By placing the solar cell area 214 at the display periphery, edge(s) or combination thereof, one can scavenge the optical power loss at the periphery/edge, and feedback the re-converted energy to increase device efficiency, reduce power consumption and improve battery life of the device 200. The battery lifetime can be improved by collecting the emitted and ambient light.

In another example, the solar cell 216 is placed behind a transparent electrode in the display area 214 so that the transparent electrode is disposed between the solar cell 216 and a light emissive device in the display area 214, thereby the transparent electrode becoming non-reflective to the emissive device.

According to the embodiments of the present invention, the power efficiency of a display associated with luminance lost in its substrate can be improved.

One or more currently preferred embodiments have been described by way of example. It will be apparent to persons skilled in the art that a number of variations and modifications can be made without departing from the scope of the invention as defined in the claims.

What is claimed is:

1. A display system, comprising:
a pixel area on which a pixel is formed;
a light-transmitting display substrate having a first side and an opposing side opposite to the first side, and a plurality of edges between the first side and the opposing side, the light-transmitting display substrate being a main substrate on which the pixel area is formed or a sealing substrate; and
a solar cell area having at least one solar cell having a light-receiving active surface and integrated on a peripheral region of the first side of the light-transmitting display substrate; and
a reflector situated on at least one of a peripheral region of the opposing side of the display substrate or on one of the plurality of edges, the reflector arranged to direct light being wave-guided through said light-transmitting display substrate to be received by the light-receiving active surface of said solar cell by reflecting said wave-guided light through the display substrate to the light-receiving active surface, wherein the pixel includes a light emissive device for emitting light, at least a portion of the emitted light being wave-guided through said light-transmitting display substrate to be received by the light-receiving active surface of said solar cell.

2. A display system according to claim 1, wherein the solar cell area is integrated on a part of the peripheral region of the light-transmitting display substrate.

3. A display system according to claim 1, wherein the pixel is formed on the first side of the light-transmitting display substrate, and wherein the reflector is a surface treatment implemented on the opposing side or on one of the plurality of edges of the light-transmitting display substrate so that light directed toward the opposing side or the plurality of edges is reflected toward the-light receiving active surface of said solar cell.

4. A display system according to claim 1, wherein the pixel is formed on the first side of the light-transmitting display substrate, and wherein the reflector is a reflective layer disposed on the opposing side or one of the plurality of edges of the light-transmitting display substrate so that light directed toward the opposing side or the plurality of edges is reflected toward the light receiving active surface of said solar cell.

5. A display system according to claim 1, further comprising a solar cell area integrated on more than one of the plurality of edges of the light-transmitting display substrate.

6. A display system according to claim 1, wherein the solar cell area is physically separated from the pixel area.

7. A display system according to claim 1, wherein the display system is an AMOLED or a AMLCD.

8. A device according to claim 1, wherein the display system is a flat panel system.

* * * * *